(12) United States Patent
Guo et al.

(10) Patent No.: US 12,163,905 B2
(45) Date of Patent: Dec. 10, 2024

(54) METHOD FOR DETERMINING PHASE-STATE TYPE AND SATURATION OF FLUID IN TIGHT RESERVOIRS BY NMR TECHNOLOGY

(71) Applicant: Southwest Petroleum University, Chengdu (CN)

(72) Inventors: Ping Guo, Chengdu (CN); Zheng Gu, Chengdu (CN); Shuoshi Wang, Chengdu (CN); Zhouhua Wang, Chengdu (CN); Qinglong Xu, Chengdu (CN); Shiyong Hu, Chengdu (CN); Wenhua Zhao, Chengdu (CN); Yisheng Hu, Chengdu (CN); Huang Liu, Chengdu (CN); Hanmin Tu, Chengdu (CN)

(73) Assignee: SOUTHWEST PETROLEUM UNIVERSITY, Chengdu (CN)

( * ) Notice: Subject to any disclaimer, the term of this patent is extended or adjusted under 35 U.S.C. 154(b) by 124 days.

(21) Appl. No.: 18/167,712

(22) Filed: Feb. 10, 2023

(65) Prior Publication Data

US 2024/0219329 A1    Jul. 4, 2024

(30) Foreign Application Priority Data

Dec. 28, 2022 (CN) ........................ 2022117002460.0

(51) Int. Cl.
*G01N 24/08* (2006.01)
*G01N 1/42* (2006.01)
*G01N 1/44* (2006.01)

(52) U.S. Cl.
CPC ............. *G01N 24/081* (2013.01); *G01N 1/42* (2013.01); *G01N 1/44* (2013.01)

(58) Field of Classification Search
CPC ........... G01N 1/42; G01N 1/44; G01N 24/081
See application file for complete search history.

(56) References Cited

U.S. PATENT DOCUMENTS

| 10,309,177 B2 * | 6/2019 | Sale ........................ E21B 25/08 |
| 11,781,962 B2 * | 10/2023 | Wang ..................... G01N 33/24 |
| | | 378/120 |
| 2020/0363354 A1 * | 11/2020 | King ...................... G01R 33/44 |

FOREIGN PATENT DOCUMENTS

| CN | 110163497 A | 8/2019 |
| CN | 112031688 A | 12/2020 |
| CN | 214886948 U | 11/2021 |

* cited by examiner

*Primary Examiner* — Gregory H Curran
(74) *Attorney, Agent, or Firm* — MUNCY, GEISSLER, OLDS & LOWE, P.C.

(57) ABSTRACT

A method for determining a phase-state type and saturation of a fluid by an NMR technology includes putting a core to be measured to an NMR phase-state testing device, injecting a heavy water solution from both ends of a gripper at the same time until the core reaches the formation pressure, and stopping; scanning the core to obtain a two-dimensional NMR map, and determining whether the core contains a gas phase; reducing the temperature of the gripper, and collecting an oil phase volume, a gas phase volume and a water phase volume discharged from the core; purge the pipelines out with nitrogen, collecting a water phase volume and an oil phase volume in the pipelines; performing dry distillation on the core to obtain an oil phase volume and a water phase volume; and obtaining the saturations of various phases according to the fluid volumes of multiple phases in the core.

5 Claims, 2 Drawing Sheets

METHOD FOR DETERMINING PHASE-STATE TYPE AND SATURATION OF FLUID IN TIGHT RESERVOIRS BY NMR TECHNOLOGY

TECHNICAL FIELD

The present invention relates to the field of oil and gas reservoir development, in particular to an experimental method for determining a phase-state type and saturation of fluid in tight shale reservoirs under original formation conditions.

BACKGROUND ART

The experimental study on the phase state of the fluid in oil reservoirs is of great significance for the calculation of reserves of oil reservoirs, oilfield development and design, dynamic analysis, oil well management, enhanced oil recovery, and numerical simulation for oil reservoirs.

The invention patent "In-Situ Coal Rock Heat-Preservation and Pressure-Preservation Coring Device and Application Method Thereof" (CN112031688A) realizes the removal of coal rock samples to maintain the temperature and pressure of an original formation to the greatest extent. The utility model patent "Drilling Pressure-Preservation Closed Coring Tool" (CN214886948U) isolates, on the basis of ensuring a coring pressure, original air in a gas storage chamber from gas released from a core by providing an elastic diaphragm so as to ensure that gas components in the core are not in contact with the outside world. The invention patent "Fluid Discrimination Method for Lei-4 Gas Reservoir Based on $T_2$-$T_1$ Two-Dimensional Intersection Diagram" (CN110163497A) forms a fluid discrimination method suitable for different gas reservoirs according to a difference between natural gas and movable water in an NMR relaxation spectrum.

The study on the phase state of conventional oil and gas reservoirs has matured, but it is difficult to obtain representative fluid in underground and aboveground conditions due to low production, large production pressure difference, etc. of tight and shale oil and gases. Under the condition that a production gas-oil ratio fluctuates greatly, it is difficult to judge an original oil-gas phase state of oil reservoirs, and it is impossible to discriminate and determine an in-situ phase state of tight shale oil reservoirs according to the existing technical means.

SUMMARY OF THE INVENTION

The present invention aims to provide a method for determining a phase-state type and saturation of fluid in tight reservoirs by an NMR technology. The method is reliable in principle and simple to operate. In this method, a core's original fluid phase state is restored by high-pressure closed coring, and the phase-state type and saturation of the fluid under original conditions of tight reservoirs are effectively determined by means of two-dimensional nuclear magnetization and dry distillation. The experimental process is controllable, and test results are in line with the engineering reality. Therefore, the method has a broad market application prospect.

The present invention adopts the following technical solutions to fulfill said technical objective.

The method for determining the phase-state type and saturation of the fluid in the tight reservoirs by the NMR technology includes the following steps in sequence:

(1) drilling a 1-inch columnar core to be measured in an axial direction at the center of a frozen core and continuously pouring liquid nitrogen into the core to be measured to prevent the fluid from heat loss;

(2) preparing a PTFE pipe with the same size as the core to be measured (to minimize a dead volume), sleeving the core to be measured with the PTFE pipe, sealing both ends of the pipe, and putting the pipe in the liquid nitrogen for freezing;

(3) putting the core to be measured, sleeved with the PTFE pipe, into a gripper, and putting the gripper into an NMR phase-state testing device, wherein the device is provided with a high-temperature circulating system, and a pressure gauge, a valve, and a heavy water solution intermediate container are respectively connected to both ends of the gripper through pipelines (the pipeline is as short as possible and the dead volume is as small as possible); a total volume of the pipelines of the device is $V_t$; the dead volumes of the pipelines and valves are filled with a prepared heavy water solution, and the gripper installation and pipeline connection are completed at the time when the nitrogen is completely evaporated with reference to a liquid nitrogen volatilization relationship diagram of the core;

(4) turning on the high-temperature circulating system to heat the gripper and gradually raising the core temperature; if the core does not restore to a formation pressure after the core restores to a formation temperature, injecting the heavy water solution from both ends of the gripper at the same time until the core reaches the formation pressure, and stopping; recording the volume $V_{iD}$ of the heavy water solution entering the gripper; if the core has restored to the formation pressure, proceeding directly to the next step;

(5) scanning the core by NMR to obtain a $T_1$-$T_2$ two-dimensional NMR map;

(6) reducing the temperature of the gripper, reducing the pressure after returning to room temperature, and collecting an oil phase volume $V_{do}$, a gas phase volume $V_{dg}$ and a water phase volume $V_{dD}$ discharged from the core during the pressure reduction process;

(7) blowing liquid in the pipelines out with nitrogen, collecting a water phase volume $V_{tD}$ and an oil phase volume $V_{to}$ in the pipelines blown out by the nitrogen, and calculating a gas phase volume $V_{tg}$ in the pipelines according to formula (1):

$$V_t = V_{tD} + V_{to} + V_{tg} \tag{1}$$

(8) calculating the volume $V_{CD}$ of the heavy water solution injected into the core (ground conditions):

$$V_{CD} = \frac{V_{iD} + V_t}{B_D} - V_{dD} - V_{tD} \tag{2}$$

in which, $V_{iD}$ is the volume of the heavy water solution injected into the gripper in the process of restoring to the formation pressure (a formation pressure condition); and $B_D$ is a volume coefficient of the heavy water solution;

(9) removing the core from the gripper for rock pyrolysis, setting the rock pyrolysis temperature below a kerogen cracking temperature, and collecting a rock pyrolysis product with an oil phase volume of $V_{ro}$ after dry distillation, and a water phase volume of $V_{rw}$ after dry distillation; and calculating an oil phase volume $V_o$ and a water phase volume $V_w$ of the core under the formation conditions, respectively:

$$V_o = (V_{do} + V_{to} + V_{ro}) * B_o \quad (3)$$

$$V_w = (V_{rw} - V_{CD}) * B_w \quad (4)$$

in which, $V_{do}$ is the oil phase volume discharged from the core during the pressure reduction process; $V_{to}$ is an oil phase volume blown out from the pipelines with nitrogen; $V_{ro}$ is an oil phase volume obtained by dry distillation; $B_o$ is a crude oil volume coefficient; $V_{rw}$ is a water phase volume obtained by dry distillation; $V_{CD}$ is a volume of the heavy water solution injected into the core; and $B_w$ is a formation water volume coefficient;

(10) determining whether the core contains a gas phase in its original state according to the $T_1$-$T_2$ two-dimensional NMR map (Romero Rojas, P. A., et al., Advanced Reservoir Characterization Using Novel NMR Technology Secures Complex Carbonate Gas Condensate Pay, A Case Study Onshore Ukraine[A]. Offshore Technology Conference[C], 2022), wherein the core contains oil-water two-phase fluid if there is no gas phase inside, and the core contains oil-water-gas three-phase fluid if there is a gas phase inside; and calculating a gas phase volume $V_g$ in the core under the formation conditions according to the following formula:

$$V_g = (V_{dg} + V_{tg}) * B_g \quad (5)$$

in which, $B_g$ is a formation gas volume coefficient; and

(11) obtaining the saturations of various phases respectively under the original conditions according to the calculated fluid volumes of multiple phases in the core under the formation conditions.

Further, in step (1), the frozen core refers to freezing with liquid nitrogen immediately after closed coring in a well site, storing formation fluid in the core so that it does not escape, and at the same time wrapping and sealing liquid around the core to prevent core pollution.

Further, in step (3), according to the liquid nitrogen volatilization relationship diagram of the core, the production process is as follows: selecting a core with exactly the same lithological and physical properties and size as the frozen core; saturating the formation water first, and then freezing with liquid nitrogen for sufficient time; drilling, at the center of the core, drilling a 1-inch diameter core in an axial direction and continuously pouring liquid nitrogen, the drilling time and the pouring time being exactly the same as those of the core to be measured; and then placing the core under room temperature and normal pressure conditions, and collecting nitrogen to obtain a relationship curve between nitrogen volatilization amount and volatilization time.

Further, in step (11), summing the fluid volumes of the multiple phases and comparing with a core pore volume; and calculating the saturations of the respective phases under the original conditions respectively, if the sum value of the fluid volumes of the multiple phases is less than or equal to the core pore volume.

Further, the heavy water solution refers to a solution with a true formation mineralization degree after being prepared from heavy water and potassium chloride. The prepared heavy water solution has no NMR signal, which can prevent the introduction of new hydrogen atom signals during the NMR scanning process.

Compared with the prior art, the present invention has the following technical effects:

(1) according to the present invention, the potassium chloride and the heavy water are prepared into a heavy water solution with a real total dissolved solid while restoring to the formation pressure, shielding the impact of external hydrogen atoms on NMR measurement;

(2) according to the relationship curve between the nitrogen volatilization amount and the volatilization time of the tested frozen core, the impact of liquid nitrogen freezing on the test results can be effectively reduced;

(3) through online measurement of a $T_1$-$T_2$ two-dimensional NMR map of a target core, the original phase state of the formation is visually displayed through the two-dimensional NMR map; and (4) the two-dimensional NMR is combined with rock pyrolysis to obtain the original fluid saturation of the core, and the calculation results are accurate and reliable.

DETAILED DESCRIPTIONS OF THE PREFERRED EMBODIMENTS

The present invention will be further described below according to the accompanying drawings and embodiments so that those skilled in the art can understand the present invention. However, it should be clear that the present invention is not limited to the scope of the specific embodiments. For those of ordinary skill in the art, as long as various changes fall within the spirit and scope of the present invention defined and determined by the appended claims, they are all protected.

Embodiment 1

In this embodiment, the original formation pressure is 30 MPa, and the formation temperature is 65° C.

Figure 1:
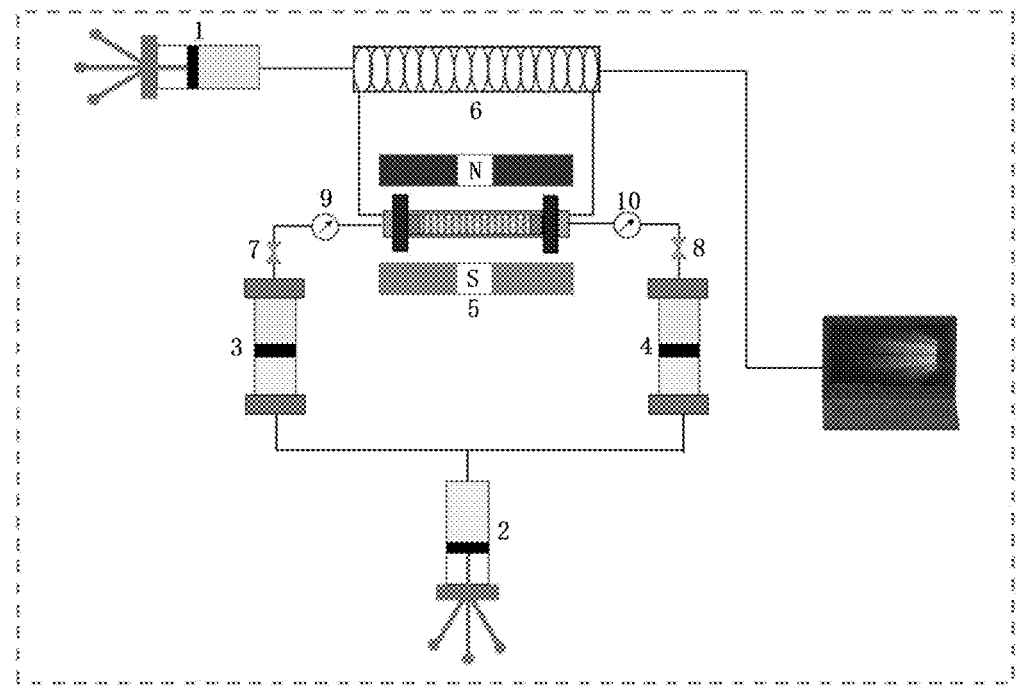
FIG. 1 is a schematic structural diagram of an NMR original phase-state testing device.
wherein, 1—confining pressure pump; 2—replacement pump; 3, 4—heavy water solution intermediate container; 5—on-line NMR core gripper; 6—high-temperature circulating system; 7, 8—valve; 9, 10—pressure gauge.

An NMR phase-state testing device (see FIG. 1) is mainly composed of an online NMR gripper 5, heavy water solution intermediate containers 3, 4, a confining pressure pump 1, a replacement pump 2, and a high-temperature circulating system 6. The NMR gripper 5 is connected to the high-temperature circulating system 6, and the circulating system 6 raises a core temperature by heating and confining pressure of a core by the confining pressure pump 1. The NMR gripper 5 has pressure gauges 9, 10 and valves 7, 8 at both ends, and an inlet end and an outlet end of the NMR core gripper are connected to the heavy water intermediate containers 3, 4, respectively.

Figure 2:
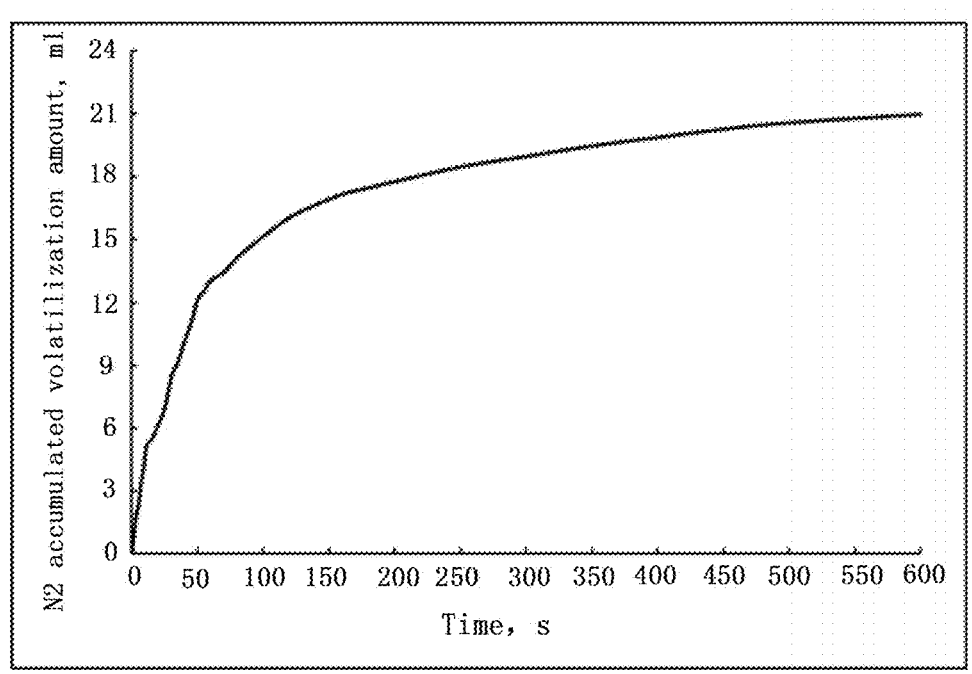
FIG. 2 shows a relationship curve diagram between nitrogen volatilization amount and volatilization time of a frozen core under room temperature and normal pressure conditions.
Figure 3:
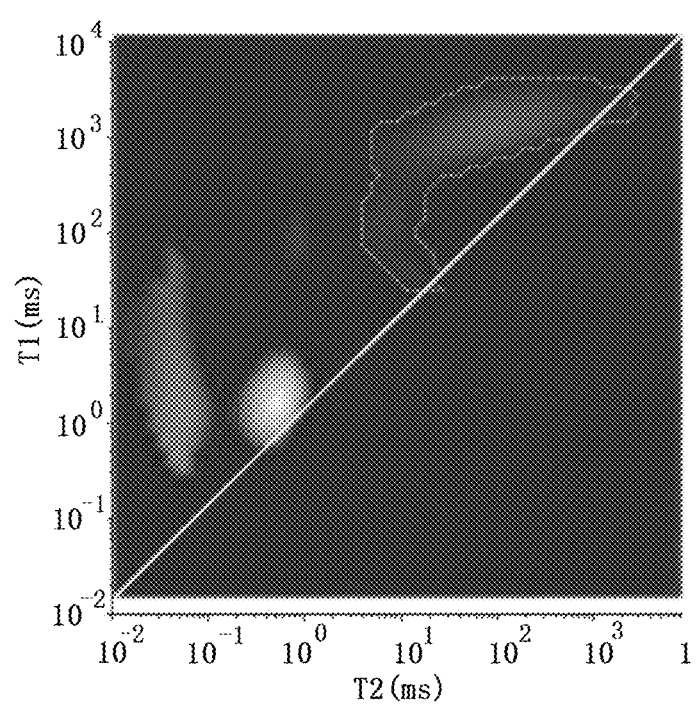
FIG. 3 is a $T_1$-$T_2$ two-dimensional NMR map of a shale core in an embodiment.

The method for determining the phase-state type and saturation of the fluid in the tight reservoirs by the NMR technology includes the following steps in sequence:

(1) preparing a heavy water solution with a salinity of 58000 ppm from potassium chloride and heavy water, and putting the heavy water solution into the intermediate containers 3, 4;

(2) drilling a 1-inch standard core having a diameter of 5 cm in an axial direction at the center of a frozen core, and continuously pouring liquid nitrogen into the core during the drilling process to prevent the fluid in the core from heat loss;

(3) selecting a core with similar lithological and physical properties and a diameter the same as the drilled core, vacuuming saturated water, and then freezing with liquid nitrogen for 48 hours; taking a 1-inch core having a diameter of 5 cm from the center of the core, and pouring liquid nitrogen continuously, the pouring time and the drilling time being consistent with those of the drilling of an experimental sample core; placing the core under room temperature and normal pressure conditions for water drainage and gas collection, and drawing a relationship diagram between liquid nitrogen volatilization amount and volatilization time (see FIG. 2);

(4) specially preparing a 1-inch PTFE core pipe having a diameter of 9.2 cm to minimize a dead volume; putting the experimental core quickly into the special PTFE pipe, sealing both ends of the pipe, and putting the pipe in a liquid nitrogen tank for freezing;

(5) connecting all pipelines to the core gripper, cleaning by replacement with petroleum ether and connecting to a nitrogen cylinder, and blowing empty for a period of time; removing impurities from the pipelines; filling a heavy water solution to the pipelines and valves respectively, wherein it can be seen that a total volume of the pipelines and valves is 2.150 ml (a volume of pipelines and valves from the valves 7, 8 to both ends of the core);

(6) putting the core sleeved with the PTFE pipe into an online NMR core gripper, and completing the putting of the core gripper into NMR equipment at a liquid nitrogen volatilization time point with reference to a liquid nitrogen volatilization curve of a tested core; closing the valves 7, 8, and raising a confining pressure synchronously according to the inlet and outlet pressure gauges 9, 10, wherein the reading is 11 MPa when the pressure gauge is stable; keeping the confining pressure always 3 MPa higher than an inlet and outlet pressure;

(7) turning on the high-temperature circulating system such that the whole system restores to a formation temperature of 65° C., wherein the pressure gauge reading is 23 MPa at this time; raising a confining pressure to 26 MPa synchronously;

(8) heating the pipelines at both ends of the core such that fluid in the pipelines is always maintained at 65° C.; opening the valves 7, 8; injecting the heavy water solution in the intermediate containers 3, 4 into the core gripper 5 by the displacement pump 2; restoring the core pressure to an original formation pressure of 30 MPa; injecting a total of 5.105 ml of heavy water solution during the pressure restoration process;

(9) selecting an NMR instrument having a model MESOMR12-060-I; measuring a two-dimensional map of the core by using an SR-CPMG sequence according to lithological characteristics of a target oil reservoir, wherein the test data is as follows: the waiting time adjustment is 5000 ms, the echo time is 0.06 ms, the number of echoes is 6000, the number of reversal time is 33, the reversal start time is 0.200 ms, the reversal end time is 5000 ms, the sampling frequency is 333 kHz, and the number of accumulation is 8; a $T_1$-$T_2$ two-dimensional NMR map of the tested core is obtained; it can be observed from the two-dimensional NMR map (FIG. 3) that the core in this experiment does not contain a gas phase under the original formation conditions;

(10) closing the valves 7 and 8, and turning off the high-temperature circulating system such that the core is cooled to room temperature slowly;

(11) disconnecting the pipelines from the lower ends of the valves 7 and 8, slowly opening the valves 7 and 8, and synchronously and slowly reducing the pressure at both ends to an atmospheric pressure and collecting fluid; after the pressure is restored to the atmospheric pressure, measuring a volume of gas discharged during the pressure reduction process to be 7.50 ml, wherein it is determined that in an original formation, the gas is completely dissolved in oil due to small amount of produced gas and no observation of gas signals in the two-dimensional NMR map, and the volume of the collected water-phase fluid is 5.740 ml and the volume of the collected oil phase is 0.095 ml;

(12) purging liquid in the pipelines from valves 7 and 8 to both ends of the core out with nitrogen; collecting a water phase having a volume of 1.220 ml and an oil phase having a volume of 0.030 ml in the pipelines, wherein a total volume of the pipelines is 2.150 ml; and calculating the gas content of 0.90 ml in the pipelines according to formula (1);

(13) a heavy water solution volume coefficient as 1.005, injecting a total of 5.080 ml of heavy water solution under room temperature and normal pressure conditions, wherein a volume $V_{CD}$ of the heavy water solution entering the core can be calculated as 0.26 ml according to a formula (2);

(14) taking the core out and performing rock pyrolysis, setting the dry distillation temperature to 300° C. (kerogen begins to be greatly pyrolyzed at 350° C.), and collecting an oil phase having a volume obtained by dry distillation as 0.780 ml and a water phase having a volume as 0.815 ml;

(15) calculating a water volume coefficient of the original formation as 1.01 and a crude oil volume coefficient as 1.37; and calculating an oil phase volume $V_o$ as 1.240 ml and a water phase volume $V_w$ as 0.562 ml according to formulas (3) and (4);

(16) performing deep cleaning on the core by a Dean-Stark method and measuring the core porosity of 7.6% and the pore volume of 1.864 ml with helium, wherein due to the impacts of measurement error, dead volumes of the pipelines and other factors, the volume of oil phases under the ground obtained by pressure reduction and dry distillation is 1.240 ml, the volume of aqueous phases under the ground is 0.562 ml, and the total volume of oil and water is 1.802 ml, which is smaller than the core pore volume; and calculating an oil-containing saturation of the core as 68.8% and the water-containing saturation as 31.2%.

The invention claimed is:

1. A method for determining a phase-state type and saturation of a fluid in tight reservoirs by an NMR technology, comprising the following steps in sequence:
   (1) drilling a 1-inch columnar core to be measured in an axial direction at the center of a frozen core, and continuously pouring liquid nitrogen into the core to be measured to prevent the fluid from heat loss;
   (2) preparing a PTFE pipe with the same size as the core to be measured, sleeving the core to be measured with the PTFE pipe, sealing both ends of the pipe, and putting the pipe in the liquid nitrogen for freezing;
   (3) putting the core to be measured, sleeved with the PTFE pipe, into a gripper, and putting the gripper into an NMR phase-state testing device, wherein the device is provided with a high-temperature circulating system, and a pressure gauge, a valve and a heavy water solution intermediate container are respectively connected to both ends of the gripper through pipelines; a total volume of the pipelines of the device is $V_t$; dead volumes of the pipelines and valves are filled with a prepared heavy water solution, and the gripper installation and pipeline connection are completed at the time when the nitrogen is completely evaporated with reference to a liquid nitrogen volatilization relationship diagram of the core;
   (4) turning on the high-temperature circulating system to heat the gripper and gradually raising a core temperature; if the core does not restore to a formation pressure after the core restores to a formation temperature, injecting the heavy water solution from both ends of the gripper at the same time until the core reaches the formation pressure, and stopping; recording a volume $V_{iD}$ of the heavy water solution entering the gripper; if the core has restored to the formation pressure, proceeding directly to the next step;
   (5) scanning the core by NMR to obtain a $T_1$-$T_2$ two-dimensional NMR map;
   (6) reducing the temperature of the gripper, reducing the pressure after returning to room temperature, and collecting an oil phase volume $V_{do}$, a gas phase volume $V_{dg}$ and a water phase volume $V_{dD}$ discharged from the core during the pressure reduction process;
   (7) blowing liquid in the pipelines out with nitrogen, collecting a water phase volume $V_{tD}$ and an oil phase volume $V_{to}$ in the pipelines blown out by the nitrogen, and calculating a gas phase volume $V_{tg}$ in the pipelines according to a formula (1):

$$V_t = V_{tD} + V_{to} + V_{tg} \qquad (1)$$

(8) calculating the volume $V_{CD}$ of the heavy water solution injected into the core:

$$V_o = (V_{do} + V_{to} + V_{ro})*B_o \qquad (3)$$

$$V_w = (V_{rw} - V_{CD})*B_w \qquad (4)$$

in which, $V_{iD}$ is the volume of the heavy water solution injected into the gripper in the process of restoring to the formation pressure; and $B_D$ is a volume coefficient of the heavy water solution;
   (9) removing the core from the gripper for rock pyrolysis; setting an oil phase volume of $V_{ro}$ after rock pyrolysis, and a water phase volume of $V_{rw}$ after rock pyrolysis; and calculating an oil phase volume $V_o$ and a water phase volume $V_w$ of the core under the formation conditions, respectively:

$$V_{CD} = \frac{V_{iD+}V_t}{B_D} - V_{dD} - V_{tD} \qquad (2)$$

in which, $V_{do}$ is the oil phase volume discharged from the core during the pressure reduction process; $V_{to}$ is an oil phase volume blown out from the pipelines with nitrogen; $V_{ro}$ is an oil phase volume obtained by dry distillation; $B_o$ is a crude oil volume coefficient; $V_{rw}$ is a water phase volume obtained by dry distillation; $V_{cD}$ is a volume of the heavy water solution injected into the core; and $B_w$ is a formation water volume coefficient;
   (10) determining whether the core contains a gas phase in its original state according to the $T_1$-$T_2$ two-dimensional NMR map, wherein the core contains oil-water two-phase fluid if there is no gas phase inside, and the core contains oil-water-gas three-phase fluid if there is a gas phase inside; and calculating a gas phase volume $V_g$ in the core under the formation conditions according to the following formula:

$$V_g = (V_{dg} + V_{tg})*B_g \qquad (5)$$

in which, $B_g$ is a formation gas volume coefficient; and
   (11) obtaining the saturations of various phases respectively under the original conditions according to the calculated fluid volumes of multiple phases in the core under the formation conditions.

2. The method for determining the phase-state type and saturation of the fluid in the tight reservoirs by the NMR technology according to claim 1, wherein in the step (1), the frozen core refers to freezing with liquid nitrogen immediately after closed coring in a well site, storing formation fluid in the core so that it does not escape, and at the same time wrapping sealing liquid around the core to prevent core pollution.

3. The method for determining the phase-state type and saturation of the fluid in the tight reservoirs by the NMR technology according to claim 1, wherein in the step (3), according to the liquid nitrogen volatilization relationship diagram of the core, the production process is as follows: selecting a core with exactly the same lithological and physical properties and size as the frozen core; saturating formation water first, and then freezing with liquid nitrogen for sufficient time; drilling, at the center of the core, a 1-inch diameter core in an axial direction and continuously pouring liquid nitrogen, the drilling time and the pouring time being exactly the same as those of the core to be measured; and then placing the core under room temperature and normal pressure conditions, and collecting nitrogen to obtain a relationship curve between nitrogen volatilization amount and volatilization time.

4. The method for determining the phase-state type and saturation of the fluid in the tight reservoirs by the NMR technology according to claim 1, wherein in the step (11), summing the fluid volumes of the multiple phases and comparing with a core pore volume; and calculating the saturations of the respective phases under the original conditions respectively if the sum value of the fluid volumes of the multiple phases is less than or equal to the core pore volume.

5. The method for determining the phase-state type and saturation of the fluid in the tight reservoirs by the NMR technology according to claim 1, wherein the heavy water solution refers to a solution with a true formation mineralization degree after being prepared from heavy water and potassium chloride.

* * * * *